(12) United States Patent
Yu et al.

(10) Patent No.: US 9,984,969 B2
(45) Date of Patent: May 29, 2018

(54) SEMICONDUCTOR DEVICES, MULTI-DIE PACKAGES, AND METHODS OF MANUFACURE THEREOF

(71) Applicant: Taiwan Semiconductor Manufacturing Company, Ltd., Hsinchu (TW)

(72) Inventors: Chen-Hua Yu, Hsinchu (TW); Hsien-Wei Chen, Hsinchu (TW); An-Jhih Su, Taoyuan (TW); Chi-Hsi Wu, Hsinchu (TW); Der-Chyang Yeh, Hsinchu (TW); Shih-Peng Tai, Xinpu Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days. days.

(21) Appl. No.: 15/601,734

(22) Filed: May 22, 2017

(65) Prior Publication Data

US 2017/0256487 A1    Sep. 7, 2017

Related U.S. Application Data

(62) Division of application No. 14/671,824, filed on Mar. 27, 2015, now Pat. No. 9,659,863.
(Continued)

(51) Int. Cl.
*H01L 23/52* (2006.01)
*H01L 23/04* (2006.01)
(Continued)

(52) U.S. Cl.
CPC ........ *H01L 23/528* (2013.01); *H01L 21/0228* (2013.01); *H01L 21/02266* (2013.01);
(Continued)

(58) Field of Classification Search
CPC ....... H01L 23/48; H01L 23/50; H01L 23/522; H01L 23/5221; H01L 23/528;
(Continued)

(56) References Cited

U.S. PATENT DOCUMENTS 4,866,507 A    9/1989    Jacobs et al.
6,586,276 B2   7/2003    Towle et al.
(Continued)

*Primary Examiner* — Fernando L Toledo
*Assistant Examiner* — Aaron Gray
(74) *Attorney, Agent, or Firm* — Slater Matsil, LLP

(57) ABSTRACT

Semiconductor device, multi-die packages, and methods of manufacture thereof are described. In an embodiment, a semiconductor device may include: first conductive pillars and second conductive pillars respectively aligned to a first row of first pins and a second row of second pins of a first die, the first pins and the second pins differing in function; a first insulating layer covering surfaces of the first conductive pillars and the second conductive pillars facing away from the first die; first pads disposed on a surface of the first insulating layer facing away from the first die, the first pads substantially aligned to the first conductive pillars; and first traces coupled to the first pads, the first traces extending over a portion of the first insulating layer covering the second conductive pillars.

20 Claims, 15 Drawing Sheets

Related U.S. Application Data

(60) Provisional application No. 62/086,071, filed on Dec. 1, 2014.

(51) Int. Cl.

| | | |
|---|---|---|
| *H01L 23/48* | (2006.01) | |
| *H01L 21/00* | (2006.01) | |
| *H01L 21/4763* | (2006.01) | |
| *H01L 23/528* | (2006.01) | |
| *H01L 21/56* | (2006.01) | |
| *H01L 21/768* | (2006.01) | |
| *H01L 21/02* | (2006.01) | |
| *H01L 23/535* | (2006.01) | |
| *H01L 23/00* | (2006.01) | |
| *H01L 23/538* | (2006.01) | |
| *H01L 21/311* | (2006.01) | |
| *H01L 23/525* | (2006.01) | |

(52) U.S. Cl.
CPC ...... *H01L 21/02271* (2013.01); *H01L 21/311* (2013.01); *H01L 21/565* (2013.01); *H01L 21/76802* (2013.01); *H01L 21/76877* (2013.01); *H01L 21/76895* (2013.01); *H01L 23/5286* (2013.01); *H01L 23/535* (2013.01); *H01L 23/5389* (2013.01); *H01L 24/19* (2013.01); *H01L 24/20* (2013.01); *H01L 21/568* (2013.01); *H01L 23/525* (2013.01); *H01L 2224/04105* (2013.01); *H01L 2224/12105* (2013.01); *H01L 2224/24137* (2013.01); *H01L 2924/10252* (2013.01); *H01L 2924/10253* (2013.01); *H01L 2924/10271* (2013.01); *H01L 2924/10272* (2013.01); *H01L 2924/10329* (2013.01); *H01L 2924/10331* (2013.01); *H01L 2924/10332* (2013.01); *H01L 2924/10333* (2013.01); *H01L 2924/10335* (2013.01); *H01L 2924/10339* (2013.01); *H01L 2924/10342* (2013.01); *H01L 2924/1431* (2013.01); *H01L 2924/1432* (2013.01); *H01L 2924/1434* (2013.01); *H01L 2924/1436* (2013.01)

(58) Field of Classification Search
CPC ............... H01L 23/5286; H01L 23/535; H01L 23/5389; H01L 24/18; H01L 24/19; H01L 24/20; H01L 24/23; H01L 24/25; H01L 2224/96; H01L 21/768; H01L 21/76802; H01L 21/76877; H01L 21/76895
USPC ....... 257/692, 698, 737, 773, 774, 700, 776, 257/E23.07; 438/107, 614, 622
See application file for complete search history.

(56) References Cited

U.S. PATENT DOCUMENTS

| | | |
|---|---|---|
| 7,564,115 B2 | 7/2009 | Chen et al. |
| 7,633,165 B2 | 12/2009 | Hsu et al. |
| 7,825,024 B2 | 11/2010 | Lin et al. |
| 7,973,413 B2 | 7/2011 | Kuo et al. |
| 8,105,875 B1 | 1/2012 | Hu et al. |
| 8,158,456 B2 | 4/2012 | Chen et al. |
| 8,183,578 B2 | 5/2012 | Wang |
| 8,183,579 B2 | 5/2012 | Wang |
| 8,227,902 B2 | 7/2012 | Kuo |
| 8,278,152 B2 | 10/2012 | Liu et al. |
| 8,426,961 B2 | 4/2013 | Shih et al. |
| 8,669,174 B2 | 3/2014 | Wu et al. |
| 8,802,504 B1 | 8/2014 | Hou et al. |
| 8,803,292 B2 | 8/2014 | Chen et al. |
| 8,803,316 B2 | 8/2014 | Lin et al. |
| 2006/0043537 A1 | 3/2006 | Frank et al. |
| 2009/0206470 A1 | 8/2009 | Horiuchi et al. |
| 2010/0327457 A1 | 12/2010 | Mabuchi |
| 2011/0278736 A1* | 11/2011 | Lin .................. H01L 25/50 257/774 |
| 2013/0234322 A1 | 9/2013 | Pendse |
| 2013/0307119 A1 | 11/2013 | Chen et al. |
| 2013/0307143 A1* | 11/2013 | Lin .................. H01L 24/19 257/737 |
| 2014/0001645 A1 | 1/2014 | Lin et al. |
| 2014/0225258 A1 | 8/2014 | Chiu et al. |
| 2014/0252572 A1 | 9/2014 | Hou et al. |

* cited by examiner

SEMICONDUCTOR DEVICES, MULTI-DIE PACKAGES, AND METHODS OF MANUFACURE THEREOF

PRIORITY CLAIM AND CROSS-REFERENCE

This application is a division of U.S. patent application Ser. No. 14/671,824, filed on Mar. 27, 2015, entitled "Semiconductor Devices, Multi-Die Packages, and Methods of Manufacture Thereof," which application claims the benefit of U.S. Provisional Application No. 62/086,071, filed on Dec. 1, 2014, entitled "Memory Die-to-Die Routing in Fan-Out Package," which applications are hereby incorporated herein by reference.

BACKGROUND

In a multi-die package, redistribution layers (RDLs) may be used to electrically connect various dies to each other. Input/output (I/O) connectors such as I/O pins of the various dies may be connected to each other through the RDLs. An advantageous feature of this packaging technology is the possibility of forming fan-out packages. Thus, the I/O pads on the die can be redistributed to cover a greater area than the die, and hence the number of I/O pads packed on the surfaces of the packaged dies can be increased.

Given the small pitch of input/output (I/O) pins on die, it is difficult to find available surface area for routing signal lines such as inter-die signal lines. Such concerns are particularly difficult to overcome with, e.g., wide input/output (WIO) memory devices, such are commonly employed today.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
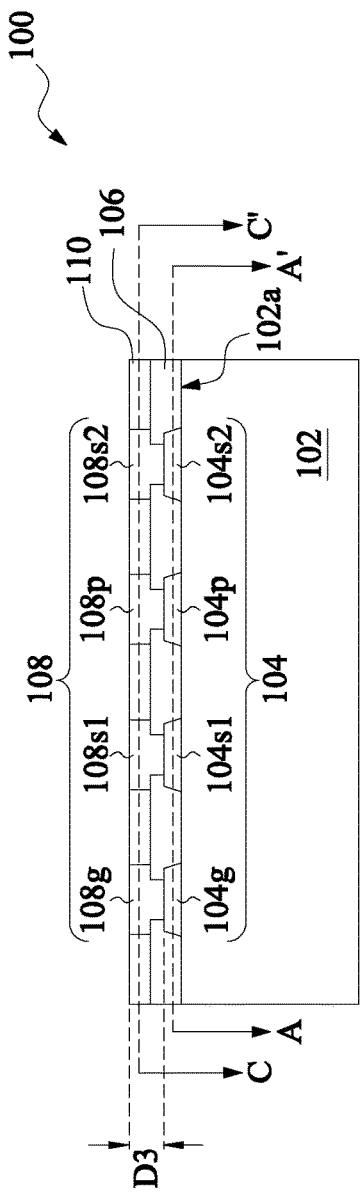
FIGS. 1A to 1C show various views of a semiconductor device comprising a polymer layer, in accordance with some embodiments.

The following disclosure provides many different embodiments, or examples, for implementing different features of the provided subject matter. Specific examples of components and stacks are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1A shows a cross-sectional view of a semiconductor device 100, in accordance with one or more embodiments. The semiconductor device 100 may include a first die 102, which may be a memory device, e.g. a dynamic random access memory (DRAM) device. In some embodiments, the first die 102 may be a wide input-output (I/O) memory device, commonly known as a WIO memory device. In other embodiments, the first die 102 may be a WIO2 memory device, which is a strong candidate for mobile DRAMs achieving high bandwidth (e.g. in a range from about 50 GB/s to about 70 GB/s). The first die 102 may include a substrate, one or more circuit components, and an interconnect structure. The substrate, the one or more active devices, and the interconnect structure of the first die 102 are not shown in FIG. 1A and are collectively labeled as the first die 102 for the sake of simplicity.

The substrate of the first die 102 may be a semiconductor wafer and may comprise silicon (Si); germanium (Ge); a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. The substrate of the first die 102 may be a bulk semiconductor substrate, a semiconductor-on-insulator (SOI) substrate, a multi-layered or gradient semiconductor substrate, or the like.

The one or more circuit components of the first die 102 may be formed within and/or atop the substrate of the first die 102 using suitable semiconductor manufacturing processes. The one or more circuit components may include at least one active device (e.g. a transistor) and/or at least one passive device (e.g. resistor, capacitor, inductor, or the like), although other circuit components may be possible as well.

The interconnect structure of the first die 102 may be formed over the substrate and the one or more circuit components of the first die 102. The interconnect structure may electrically connect the one or more circuit components of the first die 102 to form functional circuits. The interconnect structure may include one or more inter-layer dielectric (ILD) layers and/or one or more inter-metal dielectric (IMD) layers containing conductive features therein. The one or more ILD and/or IMD layers may be formed over the substrate and the one or more circuit components of the first die 102 by a suitable process (e.g. by a spin coating process or a deposition process). The one or more ILD and/or IMD layers may comprise at least one low-k dielectric material, which may have a k value, for example, less than or equal to about 4.0 (e.g. less than or equal to about 3.8). As an example, in some embodiments, the one or more ILD and/or IMD layers of the interconnect structure may be comprise an oxide (e.g. silicon oxide), a nitride (e.g. silicon nitride), an oxynitride, undoped silica glass (USG), combinations thereof, or the like. The one or more ILD and/or IMD layers may be patterned (e.g. using a combination of photolithography and etching processes) to form vias and/or trenches therein. The conductive features of the interconnect structure may subsequently be formed in the vias and/or trenches, e.g. by depositing a seed layer in the vias and/or trenches and subsequently filling the vias and/or trenches with a conductive material using, for example, a plating and/or deposition process. The conductive material may overfill the vias and/or trenches. In such an example, a planarizing process (e.g. a chemical mechanical polishing (CMP) process) may be performed on the conductive material. The conductive features may comprise copper, aluminum, tungsten, combinations thereof, or the like.

The first die 102 may have a first side 102a, which may be a surface of the ILD and/or IMD layers of the interconnect structure of the first die 102 that is farthest from the substrate of the first die 102. As an example, in the orientation shown in FIG. 1A, the first side 102a may be the top-most surface of the ILD and/or IMD layers of the interconnect structure of the first die 102. The semiconductor device 100 may include input/output (I/O) features that may be disposed at or over the first die 102. For example, pins 104 may be formed at the first side 102a of the first die 102. Only four pins 104 are shown in the example of FIG. 1A, however, in another example, more than four (e.g. five, six, seven, eight, or more) pins 104 may be formed at the first side 102a of the first die 102. The pins 104 may comprise a conductive material such as copper, aluminum, tungsten, combinations thereof, or the like. The pins 104 may comprise at least one ground pin 104g, at least one power pin 104p, at least one first signal pin 104s1, and at least one second signal pin 104s2. The ground pin 104g and the power pin 104p may be directed respectively to the ground and power functions of the first die 102, while the first signal pin 104s1 and the second signal pin 104s2 may be directed to the signal functions of the first die 102. In other words, the ground pin 104g and the first signal pin 104s1 may differ in function. Similarly, the power pin 104p and the first signal pin 104s1 may differ in function. In like manner, the second signal pin 104s2 may have a function different from the ground pin 104g and the power pin 104p.

The semiconductor device 100 may also include a passivation layer 106 formed on or over the first side 102a of the first die 102 and over peripheral portions of each of the pins 104. For example, the passivation layer 106 may comprise openings that are aligned to central portions the pins 104, while peripheral portions of the pins 104 are substantially covered by the passivation layer 106. The passivation layer 106 may protect the first die 102 from various environmental contaminants. The passivation layer 106 may comprise a dielectric material, examples of which include a polyimide, a polymer, an oxide (e.g. a silicon containing oxide, e.g. SiO), a nitride (e.g. a silicon containing nitride, e.g. SiN), an oxynitride (e.g. a silicon containing oxynitride), undoped silicate glass (USG), combinations thereof, or the like.

Figure 1B:
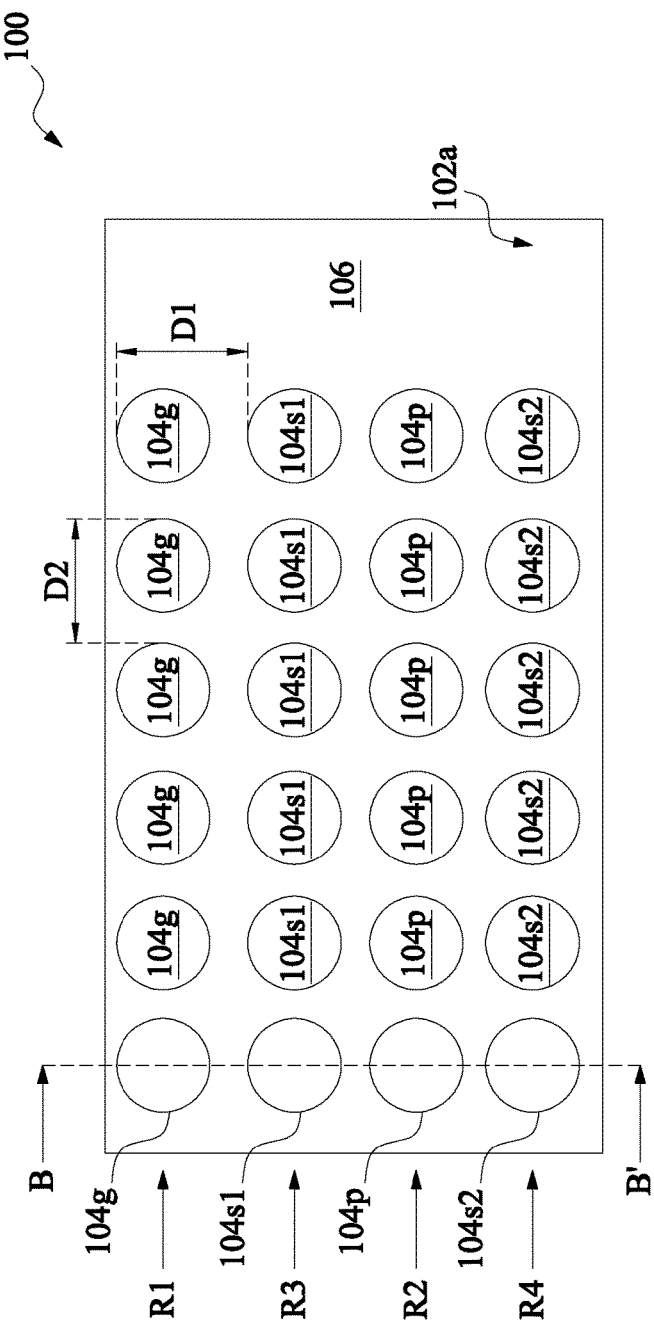

FIG. 1B shows a plan view illustrating a layout of the pins 104, in accordance with one or more embodiments. The layout shown in FIG. 1B may, for example, be a view of the semiconductor device 100 taken along the line A-A' shown in FIG. 1A, while the cross-sectional view of the first die 102, the pins 104, and the passivation layer 106 shown in FIG. 1A may, for example, be a view of the semiconductor device 100 shown in FIG. 1B taken along the line B-B'. As illustrated in FIG. 1B, the pins 104 may be arranged as a matrix, e.g. in a top-down view. Such an arrangement may be present in an embodiment where the first die 102 is a WIO2 memory device. In the example of FIG. 1B, the matrix comprises four rows R1, R2, R3, R4, with each row comprising six pins. However, the number of rows in the matrix and the number of pins per row may be different in other embodiments.

As illustrated in FIG. 1B, the ground pins 104g, power pins 104p, first signal pins 104s1, and second signal pins 104s2 may be arranged on respective rows of the matrix. In the example of FIG. 1B, the ground pins 104g may be arranged along a first row R1 of the matrix, while the power pins 104p may be arranged along a second row R2 of the matrix different from the first row R1. Furthermore, as illustrated in FIG. 1B, the first row R1 comprising the ground pins 104g is separated from the second row R2 comprising the power pins 104p by a third row R3 of the matrix comprising the first signal pins 104s1. Furthermore, in the example of FIG. 1B, the third row R3 comprising first signal pins 104s1 is separated from a fourth row R4 of the matrix comprising the second signal pins 104s2 by the second row R2 comprising the power pins 104p. In other words, pins arranged along a respective row of the matrix have identical functions, while different pins arranged along immediately adjacent rows of the matrix differ in function.

As shown in FIG. 1B, the pins 104 in immediately adjacent rows (e.g. first row R1 and third row R3) may be separated by a first distance D1, which may be in a range from about 10 micrometers to about 60 micrometers (e.g. about 40 micrometers). As another example, pins 104 in a given row (e.g. first row R1) that are immediately adjacent to each other may be separated by a second distance D2, which may also be in the range from about 10 micrometers to about 60 micrometers (e.g. about 40 micrometers). In other words, the pins 104 of a given row of the matrix and the pins 104 in a given column of the matrix may have a pitch in the range from about 10 micrometers to about 60 micrometers (e.g. about 40 micrometers).

Referring back to FIG. 1A, the semiconductor device 100 may also include conductive pillars 108 aligned to and electrically connected to the pins 104. In some embodiments, a first portion (e.g. a lower portion) of a respective conductive pillar 108 may be disposed in the opening in the passivation layer 106, while a second portion (e.g. an upper portion) of the respective conductive pillar 108 may extend over a surface of the passivation layer 106 facing away from the first die 102, as shown in FIG. 1A. In the embodiment of FIG. 1A, the conductive pillars 108 may have sidewalls that are substantially perpendicular to a surface of the pins 104 and/or a surface of the passivation layer 106 facing away from the first die 102. However, in other embodiments, the conductive pillars 108 may have tapered sidewalls. In yet another embodiment, the conductive pillars 108 may be shaped as bumps.

A respective conductive pillar 108 may be aligned and electrically connected to a respective pin 104. For instance, in the example shown in FIG. 1A, the conductive pillars 108 may include a ground conductive pillar 108g, a first signal conductive pillar 108s1, a power conductive pillar 108p, and a second signal conductive pillar 108s2 respectively aligned and electrically connected to the ground pin 104g, the first signal pin 104s1, the power pin 104p, and the second signal pin 104s2. The conductive pillars 108 may comprise copper, aluminum, tungsten, combinations thereof, or the like, although other suitable materials (e.g. other metals and/or metal alloys) may also be used for the conductive pillars 108. The conductive pillars 108 may extend from the pins 104 by a third distance D3, which may be in a range from about 5 micrometers to about 30 micrometers, for example.

Also shown in FIG. 1A is a polymer layer 110 disposed over the passivation layer 106 and around the conductive pillars 108. A surface of the polymer layer 110 facing away from the first die 102 may be substantially coplanar with a surface of the conductive pillars 108 facing away from the first die 102. The polymer layer 110 may comprise an insulating material, such as polyimide (PI), polybenzoxazole (PBO), benzocyclobuten (BCB), epoxy, silicone, acrylates, nano-filled pheno resin, siloxane, a fluorinated polymer, polynorbornene, or the like. In an embodiment, the material of the polymer layer 110 may be different from the material of the passivation layer 106.

Figure 1C:
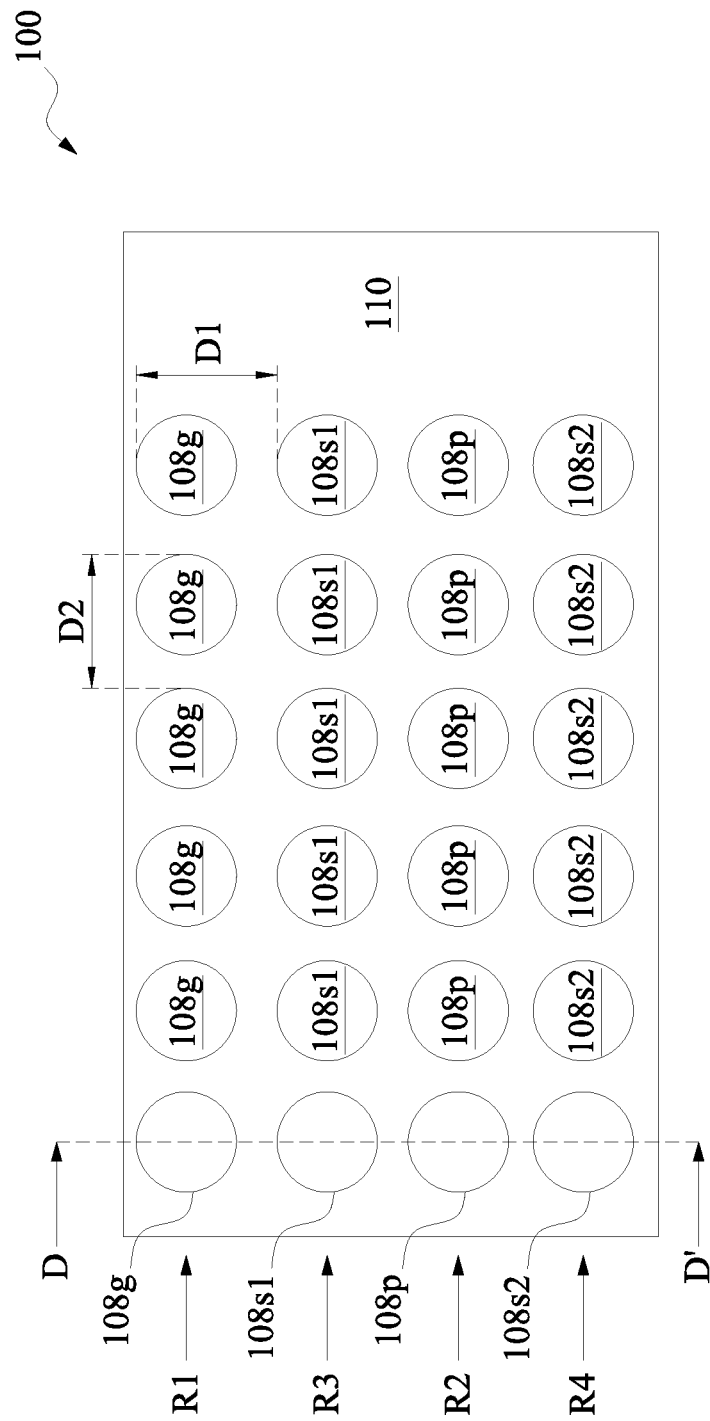

As described above in relation to FIG. 1B, the pins 104 may be arranged as a matrix, e.g. in a top-down view. Similarly, since the conductive pillars 108 are aligned to the pins 104, the conductive pillars 108 may also be arranged as a matrix, e.g. in a top-down view. This is illustrated in FIG. 1C, which shows a layout of the conductive pillars 108, in accordance with one or more embodiments. The layout shown in FIG. 1C may, for example, be a view of the semiconductor device 100 shown in FIG. 1A taken along the line C-C', while the cross-sectional view shown in FIG. 1A may, for example, be a view of the semiconductor device 100 shown in FIG. 1C taken along the line D-D'.

In the layout shown in FIG. 1C, the ground conductive pillars 108g may be arranged along the first row R1 of the matrix (e.g. over the ground pins 104g), while the power conductive pillars 108p may be arranged along the second row R2 of the matrix (e.g. over the power pins 104p). Furthermore, as illustrated in FIG. 1C, the first row R1 comprising the ground conductive pillars 108g is separated from the second row R2 comprising the power conductive pillars 108p by the third row R3 comprising the first signal conductive pillars 108s1 (e.g. disposed over the first signal pins 104s1). Furthermore, in the example of FIG. 1C, the second row R2 comprising the power conductive pillars 108p separates the third row R3 comprising the first signal conductive pillars 108s1 and the fourth row R4 comprising the second signal conductive pillars 108s2 (e.g. disposed over the second signal pins 104s2).

Since the conductive pillars 108 are aligned to the pins 104, the conductive pillars 108 may have a pitch similar to the pitch of the pins 104. For example, as shown in FIG. 1C, conductive pillars 108 in immediately adjacent rows (e.g. first row R1 and third row R3) may be separated by the first distance D1, while conductive pillars 108 in a given row (e.g. first row R1) that are immediately adjacent to each other may be separated by the second distance D2.

The semiconductor device 100 may, as an example, be a part of a multi-die package comprising a plurality of dies. For example, the semiconductor device 100 may be included in a fan-out multi-die package, and at least one second die may be placed adjacent to (e.g. laterally adjacent to) the semiconductor device 100. The semiconductor device 100 and the adjacent second die may be encapsulated in a molding compound to form the fan-out multi-die package (e.g. see description below in respect of FIGS. 5C and 5D). There may be a need to route signal traces (e.g. inter-die signal traces) between the semiconductor device 100 and the at least one second die, e.g. to enable the exchange of signals between the various dies of the fan-out multi-die package.

The signal traces may also be referred to as signal lines or inter-die signal lines. At least a portion of these signal traces may be formed in a first redistribution layer (RDL) formed over the conductive pillars 108 and the polymer layer 110.

Figure 2A:
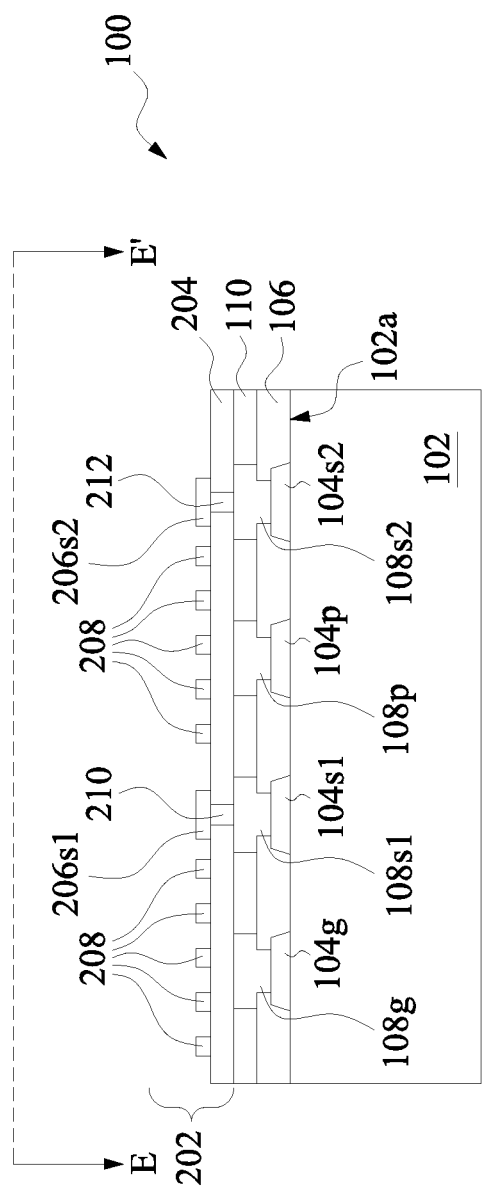
FIGS. 2A to 2D show various views of a semiconductor device comprising signal traces, a ground bridging line, and a power bridging line formed in different levels of the semiconductor device, in accordance with some embodiments.

FIG. 2A shows a first RDL 202 disposed over the conductive pillars 108 and the polymer layer 110. The first RDL 202 may include a first insulating layer 204, at least one first signal pad 206s1, at least one second signal pad 206s2, and signal traces 208 disposed over the first insulating layer 204 (e.g. over a surface of the first insulating layer 204 facing away from the first die 102). The first signal pad 206s1, second signal pad 206s2, and signal traces 208 may function to electrically connect the first die 102 to another die that may be placed adjacent to the semiconductor device 100.

As shown in FIG. 2A, the first signal pad 206s1 may be electrically connected to the first signal conductive pillar 108s1 by a first via 210, while the second signal pad 206s2 may be electrically connected to the second signal conductive pillar 108s2 by a second via 212. The first via 210 and the second via 212 may extend through the first insulating layer 204 and may be respectively aligned to the first signal conductive pillar 108s1 and the second signal conductive pillar 108s2. In addition, the first signal pad 206s1 and the second signal pad 206s2 may also be respectively aligned to the first signal conductive pillar 108s1 and the second signal conductive pillar 108s2. For example, the first via 210 and the first signal pad 206s1 may be substantially aligned to a central region of the first signal conductive pillar 108s1. Similarly, the second via 212 and the second signal pad 206s2 may be substantially aligned to a central region of the second signal conductive pillar 108s2. The first via 210 and the second via 212 may have a width (e.g. a diameter) in a range from about 3 micrometers to about 12 micrometers (e.g. about 5 micrometers), which is less than the widths (e.g. diameters) of the first signal conductive pillar 108s1 and the second signal conductive pillar 108s2, which may be in a range from about 10 micrometers to about 30 micrometers (e.g. about 25 micrometers).

In an embodiment, the first insulating layer 204 may comprise low-k dielectric materials and may be similar in composition to the ILD and/or IMD layers of the first die 102 or the passivation layer 106. In some embodiments, the first insulating layer 204 and the polymer 110 may have substantially similar compositions. The first via 210 and the second via 212 may be filled with conductive material comprising copper, aluminum, tungsten, combinations thereof, or the like. The first signal pad 206s1, the second signal pad 206s2, and the signal traces 208 may comprise similar conductive materials.

Figure 2B:
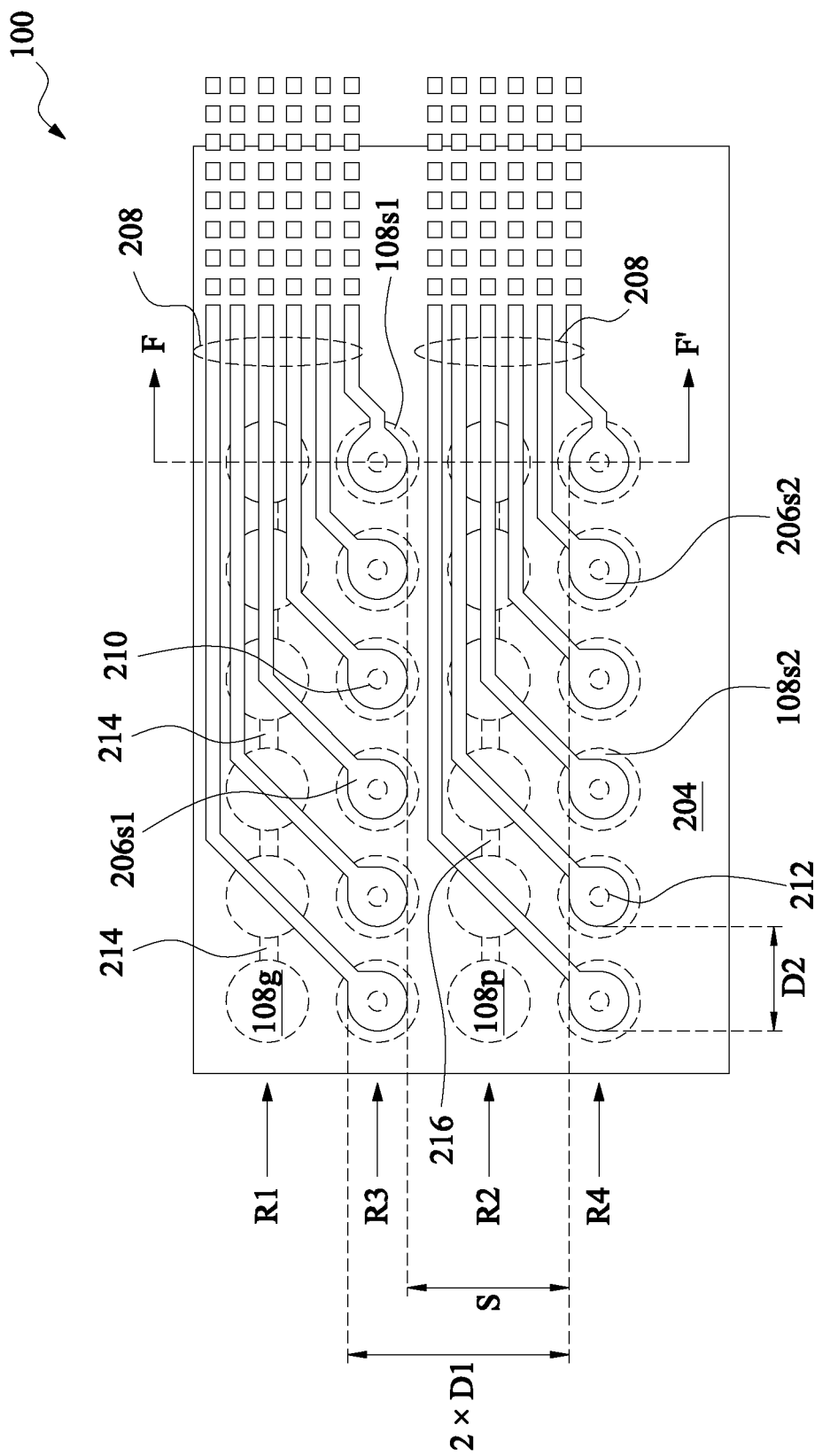

As described above in relation to FIG. 1C, the conductive pillars 108 may be arranged as a matrix, e.g. in a top-down view. Each of the first signal conductive pillars 108s1 may have a respective first via 210 and a respective first signal pad 206s1 electrically connected and aligned to it. Similarly, each of the second signal conductive pillars 108s2 may have a respective second via 212 and a respective second signal pad 206s2 electrically connected and aligned to it. Consequently, the first signal pads 206s1 and the second signal pads 206s2 may also be arranged as a matrix, e.g. in a top-down view. FIG. 2B shows a plan view illustrating a layout of the first signal pads 206s1 and the second signal pads 206s2, in accordance with one or more embodiments. The layout shown in FIG. 2B may, for example, be a view of the semiconductor device 100 shown in FIG. 2A taken along the line E-E', while the cross-sectional view shown in FIG. 2A may, for example, be a view of the semiconductor device 100 shown in FIG. 2B taken along the line F-F'.

In the layout shown in FIG. 2B, the first signal pads 206s1 may be arranged along the third row R3 of the matrix (e.g. over the first signal conductive pillars 108s1) while the second signal pads 206s2 may be arranged along the fourth row R4 of the matrix (e.g. over the second signal conductive pillars 108s2). Also shown in FIG. 2B are the first vias 210 (shown as dashed lines) that are disposed below the first signal pads 206s1, but over the first signal conductive pillars 108s1 (also shown as dashed lines). FIG. 2B also shows the second vias 212 (shown as dashed lines) that are disposed below the second signal pads 206s2, but over the second signal conductive pillars 108s2 (also shown as dashed lines).

A respective signal trace 208 may be coupled to a respective first signal pad 206s1 or a respective second signal pad 206s2, as shown in FIG. 2B. Furthermore, since the first insulating layer 204 covers the second row R2 comprising the power conductive pillars 108p, the space S between the third row R3 comprising the first signal pads 206s1 and the fourth row R4 comprising the second signal pads 206s2 may be used for the routing of the signal traces 208 (e.g. the signal traces 208 coupled to the second signal pads 206s2). It is noted that the space S corresponds to the surface of the portion of the first insulating layer 204 covering the power conductive pillars 108p. As a further example, since the first insulating layer 204 covers the first row R1 comprising the ground conductive pillars 108g, the surface of the portion of the first insulating layer 204 covering the ground conductive pillars 108g may also be used for the routing of the signal traces 208 (e.g. the signal traces 208 coupled to the first signal pads 206s1).

The third row R3 comprising the first signal pads 206s1 and the fourth row R4 comprising the second signal pads 206s2 may be separated by twice the first distance D1 (indicated in FIG. 2B as "2×D1"). In other words, the third row R3 comprising the first signal pads 206s1 and the fourth row R4 comprising the second signal pads 206s2 may be separated by a distance in a range from about 40 micrometers to about 120 micrometers (e.g. about 80 micrometers). However, it is noted that for a given row (e.g. the third row R3 or the fourth row R4), the pitch of the signal pads 206s1 or 206s2 may be substantially equal to the second distance D2.

In an embodiment, the first signal pads 206s1 and/or the second signal pads 206s2 may have a width (e.g. a diameter) in a range from about 10 micrometers to about 30 micrometers (e.g. about 20 micrometers). Consequently, the space S available for the routing of the signal traces 208 may be in a range from about 35 micrometers to about 85 micrometers. In an example where a width of each of the signal traces 208 is in a range from about 1 micrometers to about 10 micrometers (e.g. about 5 micrometers) and immediately adjacent signal traces 208 are spaced apart by about 1-10 micrometers, then the number of signal traces 208 that can be routed in the space S may be about 3 signal traces to about 8 signal traces.

Figure 2C:
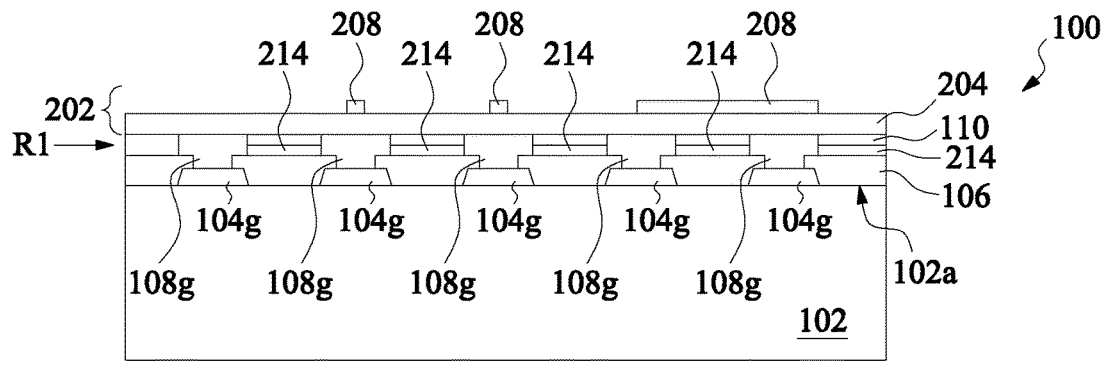

In addition to routing the signal traces 208 from the first die 102 to at least one second die of a multi-die package, a ground bridging line 214 may be used to bridge the ground conductive pillars 108g of the semiconductor device 100 to each other. FIG. 2C illustrates the ground bridging line 214 in greater detail and may, as an example, be obtained by taking a cross-section along the first row R1 shown in FIG. 2B comprising the ground conductive pillars 108g. The ground bridging line 214 may comprise similar materials as the ground conductive pillars 108g. As shown in FIGS. 2B and 2C, the ground bridging line 214 may comprise sections disposed between the ground conductive pillars 108g of the first row R1 and may serve to electrically connect the ground conductive pillars 108g to one another. The ground bridging line 214 may be disposed on the surface of the passivation layer 106 facing away from the first die 102 and may be covered by the polymer layer 110. Consequently, the ground bridging line 214 and the signal traces 208 are disposed on different levels (e.g. different interconnect levels) of the semiconductor device 100. In this way, signal traces 208 can be routed—using the first RDL 202—in the space that would have otherwise been occupied by ground routing (e.g. the ground bridging line 214) if the ground bridging line 214 was formed on the same interconnect level as the signal traces 208. This allows for a greater number of signal traces 208 in the first RDL 202 and/or wider signal traces 208 and/or a larger spacing between immediately adjacent signal traces 208 in the first RDL 202, without having to decrease the width of the first signal pad 206s1 and/or the width of the second signal pad 206s2. For example, the signal traces 208 may be routed such that each signal trace 208 has a width of about 5 micrometers and is separated from an immediately adjacent signal trace 108 by about 5 micrometers. Having wider signal traces 208 and/or a larger spacing between immediately adjacent signal traces 208 may, in turn, improve performance of the semiconductor device 100 and the fan-out multi-die package including the semiconductor device by lowering resistance and/or line capacitance. FIG. 2B shows five or six signal traces 208 being routed in the space that would have otherwise been occupied by the ground bridging line 214 if the ground bridging line 214 was formed on the same interconnect level as the signal traces 208.

Figure 2D:
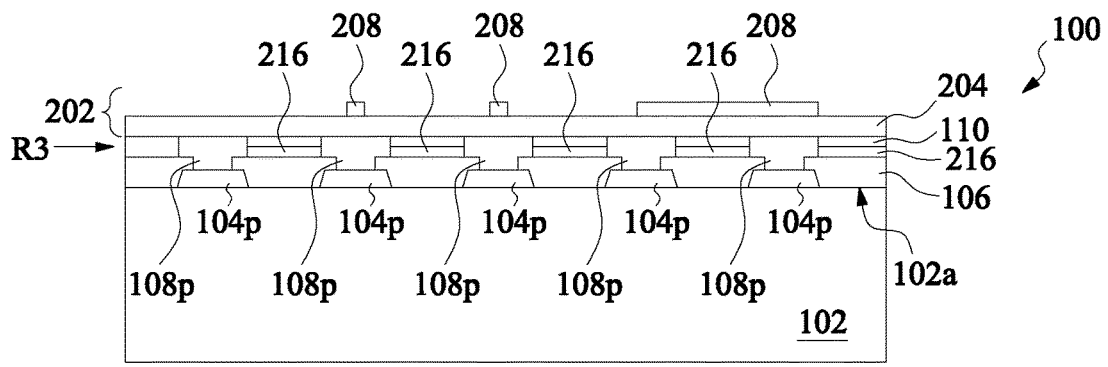

In like manner, a power bridging line 216 may be used to bridge the power conductive pillars 108p to each other. FIG. 2D illustrates the power bridging line 216 in greater detail and may, as an example, be obtained by taking a cross-section along the third row R3 comprising the power conductive pillars 108p. The power bridging line 216 may comprise similar materials as the power conductive pillars 108g. As shown in FIGS. 2B and 2D, the power bridging line 216 may comprise sections disposed between the power conductive pillars 108p of the third row R3 and may serve to electrically connect the power conductive pillars 108p to one another. The power bridging line 216 may be disposed on the surface of the passivation layer 106 facing away from the first die 102 and may be covered by the polymer layer 110. Consequently, the power bridging line 216 and the signal traces 208 are also disposed on different levels (e.g. different interconnect levels) of the semiconductor device 100. In this way, signal traces 208 can be routed—using the first RDL 202—in the space that would have otherwise been occupied by power routing (e.g. the power bridging line 216) if the power bridging line 216 was formed on the same interconnect level as the signal traces 208. The advantages that follow from this are similar to the advantages described above in respect of having the ground bridging line 214 and the signal traces 208 on different interconnect levels of the semiconductor device 100.

Figure 3A:
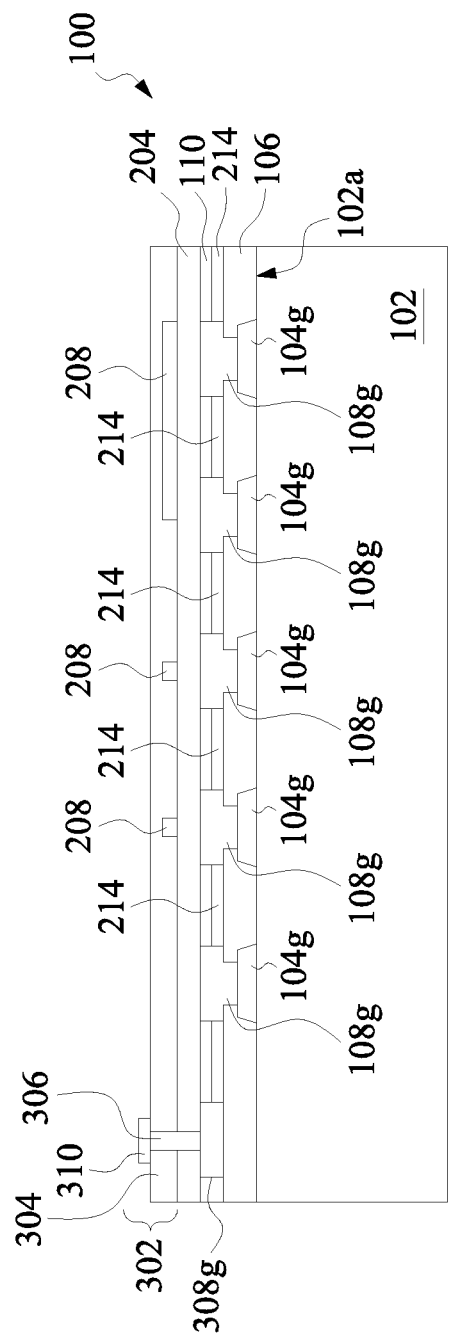
FIGS. 3A to 3C and FIGS. 4A to 4C show various views of a semiconductor device comprising redistribution of a ground bridging line and a power bridging line, in accordance with some embodiments.
Figure 3B:
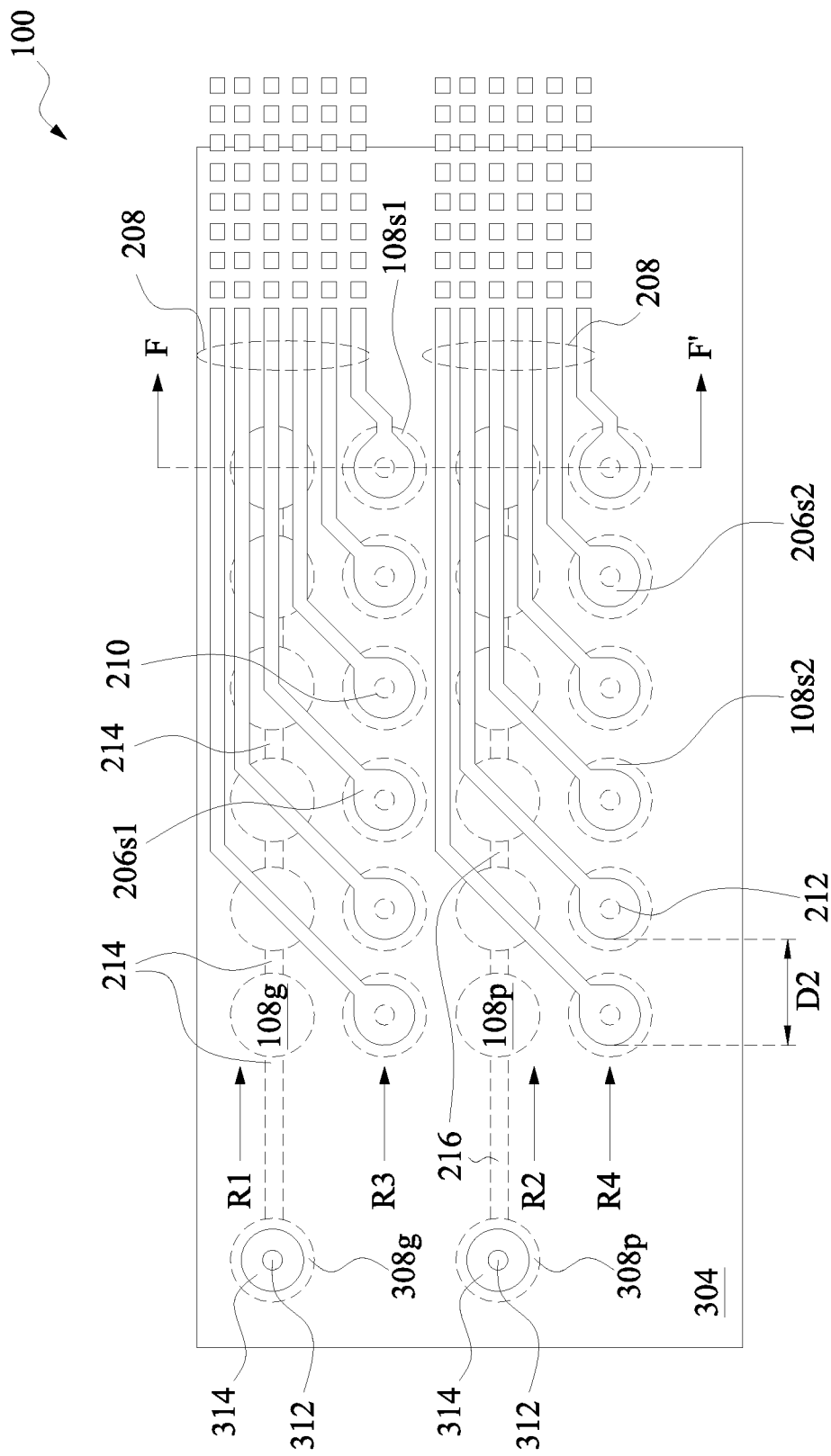

In some embodiments, the ground bridging line 214 may need to be redistributed out (e.g. to a ground connection that is external to the semiconductor device 100). FIGS. 3A and 3B show a ground connector 308g disposed adjacent to (e.g. laterally adjacent to) the first row R1 comprising ground conductive pillars 108g that allows for this. As shown in FIGS. 3A and 3B, the ground bridging line 214 may be extended to couple with the ground connector 308g that is disposed adjacent to an outermost ground conductive pillar 108g of the first row R1 of ground conductive pillars 108g.

As illustrated in FIG. 3A, in contrast to the ground conductive pillars 108g that extend at least partially through the passivation layer 106, the ground connector 308g is formed on the surface of the passivation layer 106 facing away from the first die 102, and no portion of the ground connector 308g extends through the passivation layer 106. The ground connector 308g may comprise similar materials as the ground conductive pillars 108g. A second RDL 302 may be formed over the first RDL 202. The second RDL 302 may include a second insulating layer 304 (e.g. comprising similar materials as the first insulating layer 204) that may be formed over the first insulating layer 204 and the signal traces 208. Consequently, the signal traces 208 are covered by the second insulating layer 304, and a surface of the second insulating layer 304 facing away from the first die 102 (e.g. a top surface of the second insulating layer 304 for the orientation shown in FIG. 3A) may be used to route and/or redistribute the ground bridging line 214. For example, a third via 306 may extend through the first insulating layer 204 and the second insulating layer 304 and may couple to a ground pad 310 that may be disposed on the surface of the second insulating layer 304 facing away from the first die 102 (e.g. the top surface of the second insulating layer 304). The ground pad 310 may be coupled to a ground trace (not shown) that extends on the surface of the second insulating layer 304, e.g. towards the ground connection that is external to the semiconductor device 100.

Figure 3C:
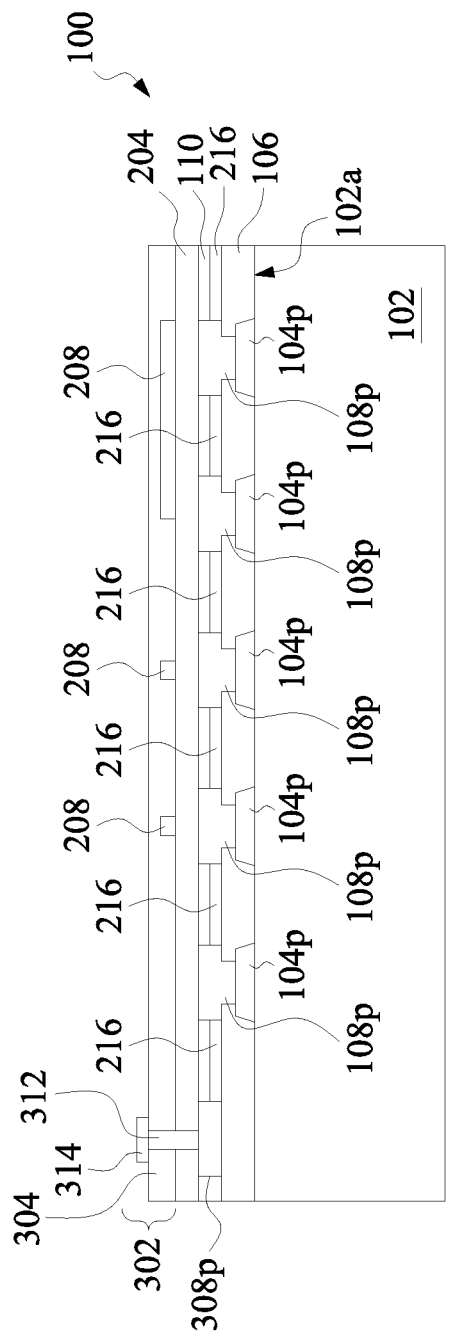

Similarly, in some embodiments, the power bridging line 216 may need to be redistributed out (e.g. to a power source that is external to the semiconductor device 100). FIGS. 3B and 3C show a power connector 308p disposed adjacent to (e.g. laterally adjacent to) the second row R2 comprising power conductive pillars 108p that allows for this. As shown in FIGS. 3B and 3C, the power bridging line 216 may be extended to couple with the power connector 308p that is disposed adjacent to an outermost power conductive pillar 108p of the second row R2 of power conductive pillars 108p. In contrast to the power conductive pillars 108p that extend at least partially through the passivation layer 106, the power connector 308p is formed on the surface of the passivation layer 106 facing away from the first die 102, and no portion of the power connector 308p extends through the passivation layer 106. The power connector 308p may comprise similar materials as the power conductive pillars 108p. The signal traces 208 are covered by the second insulating layer 304, and the surface of the second insulating layer 304 facing away from the first die 102 (e.g. the top surface of the second insulating layer 304) may be used to route and/or redistribute the power bridging line 216. For example, a fourth via 312 may extend through the first insulating layer 204 and the second insulating layer 304 and may couple to a power pad 314 that may be disposed on the surface of the second insulating layer 304 facing away from the first die 102 (e.g. the top surface of the second insulating layer 304). The power pad 314 may be coupled to a power trace (not shown) that extends on the surface of the second insulating layer 304, e.g. towards the power source that is external to the semiconductor device 100.

As a result, the redistribution of the ground bridging line 214 and/or the power bridging line 216 is on a different level (e.g. interconnect level) of the semiconductor device 100 than the signal traces 208. In this way, signal traces 208 can be routed—using the first RDL 202—in the space that would have otherwise been occupied by redistribution of the ground bridging line 214 and the power bridging line 216. The advantages that follow from this are similar to the advantages described above in respect of having the ground bridging line 214 and the signal traces 208 on different interconnect levels of the semiconductor device 100.

Figure 4A:
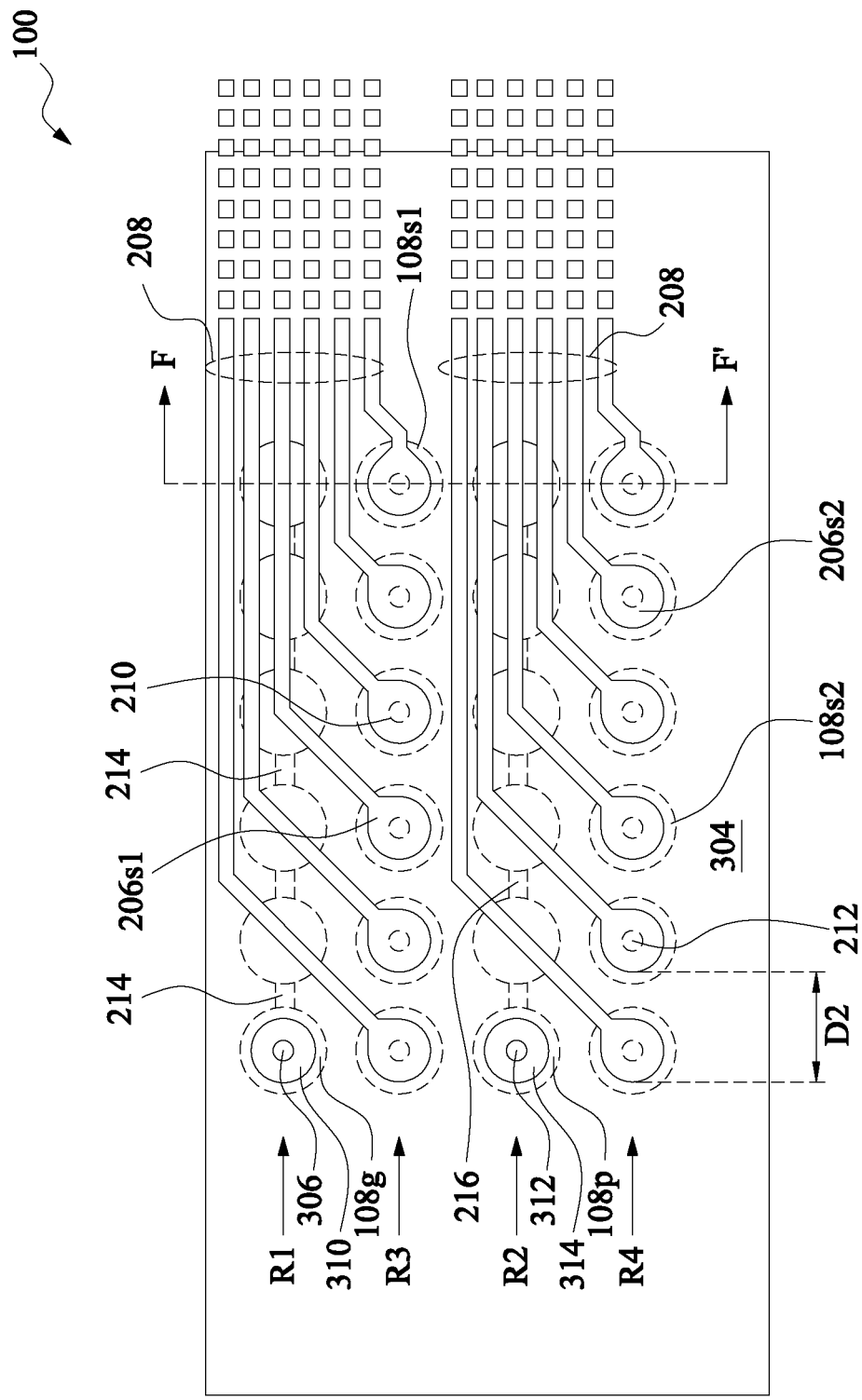
Figure 4B:
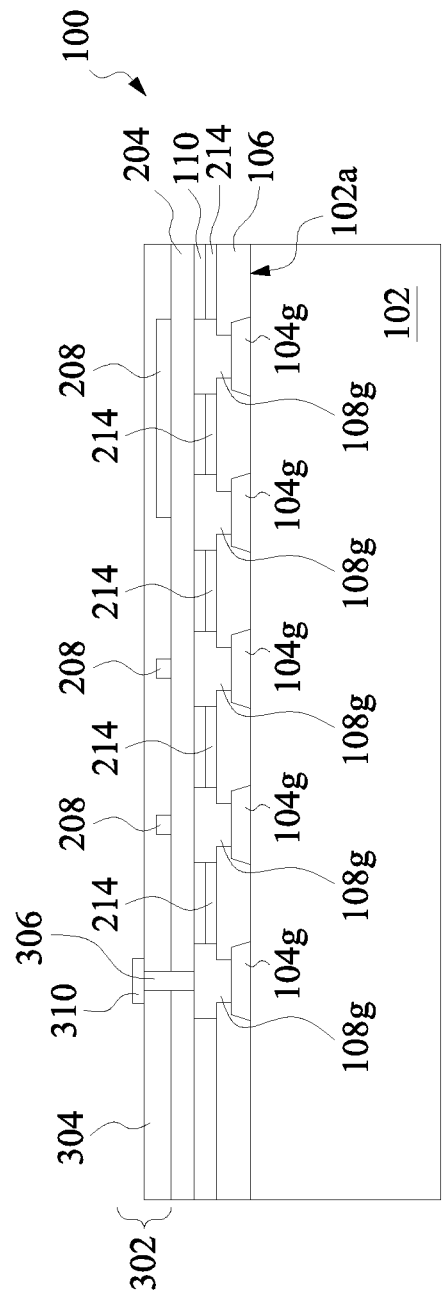
Figure 4C:
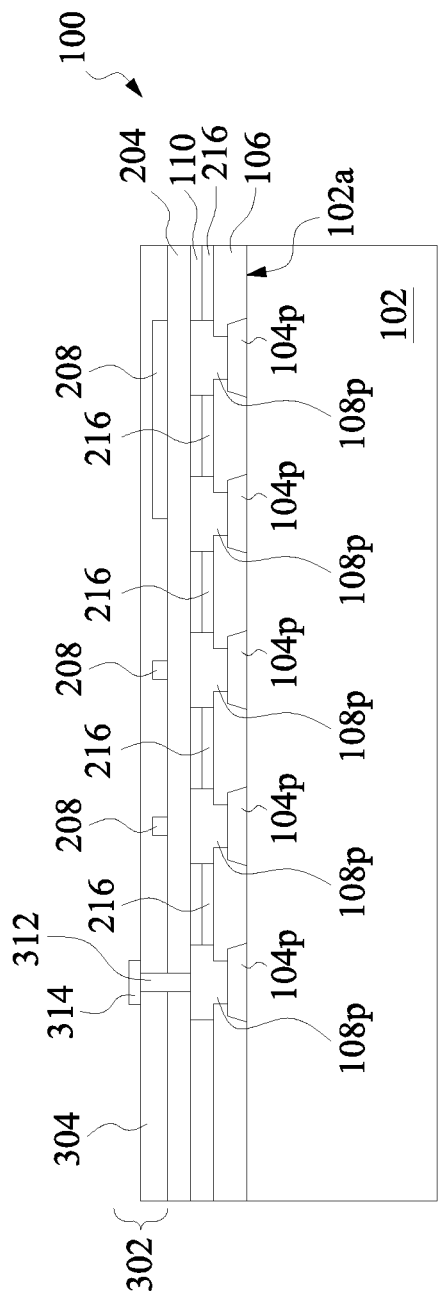

In some embodiments, the redistribution of the ground bridging line 214 may be accomplished by using the outermost ground conductive pillar 108g of the first row R1 of ground conductive pillars 108g instead of the ground connector 308g. This embodiment is illustrated in FIGS. 4A and 4B. In like matter, in some embodiments, the redistribution of the power bridging line 216 may be accomplished by using the outermost power conductive pillar 108p of the second row R2 of power conductive pillars 108p instead of the power connector 308p. This embodiment is illustrated in FIGS. 4A and 4C.

In yet another embodiment, the redistribution of the ground bridging line 214 may be accomplished by using the outermost ground conductive pillar 108g of the first row R1 of ground conductive pillars 108g as well as the ground connector 308g. Similarly, the redistribution of the power bridging line 216 may be accomplished by using the outermost power conductive pillar 108p of the second row R2 of power conductive pillars 108p as well as the power connector 308p. These embodiments are, in essence, a combination of the embodiments shown in FIGS. 4A to 4C and the embodiments shown in FIGS. 3A to 3C, and are not illustrated for the sake of brevity.

Figure 5A:
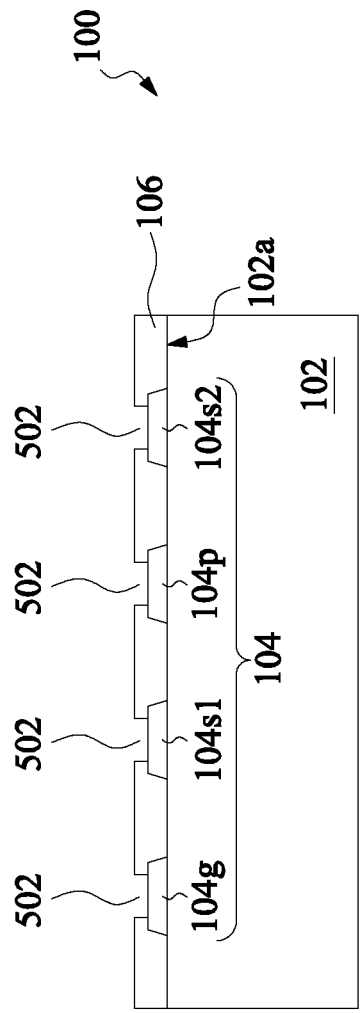
FIGS. 5A to 5F show a process flow illustrating various intermediary steps of manufacturing a semiconductor device, in accordance with some embodiments.

FIGS. 5A to 5F show a process flow illustrating various intermediary steps of manufacturing the semiconductor device 100, in accordance with one or more embodiments. As shown in FIG. 5A, the passivation layer 106 may be formed over the pins 104 using any suitable process, such as, chemical vapor deposition (CVD), physical vapor deposition (PVD), atomic layer deposition (ALD), combinations thereof, or the like. Subsequently, openings 502 that are substantially aligned to central portions of the pins 104 may be formed in the passivation layer 106, e.g. to expose at least the central portions of the pins 104, while peripheral portions of the pins 104 remain substantially covered by the passivation layer 106. The openings 502 may be formed using a masking and etching process (e.g. a lithographic masking followed by a dry or wet etch process), although other suitable processes may be possible as well. Subsequently, the first die 102 may be subjected to testing, e.g., through contact probing of the pins 104 through the openings 502.

Figure 5B:
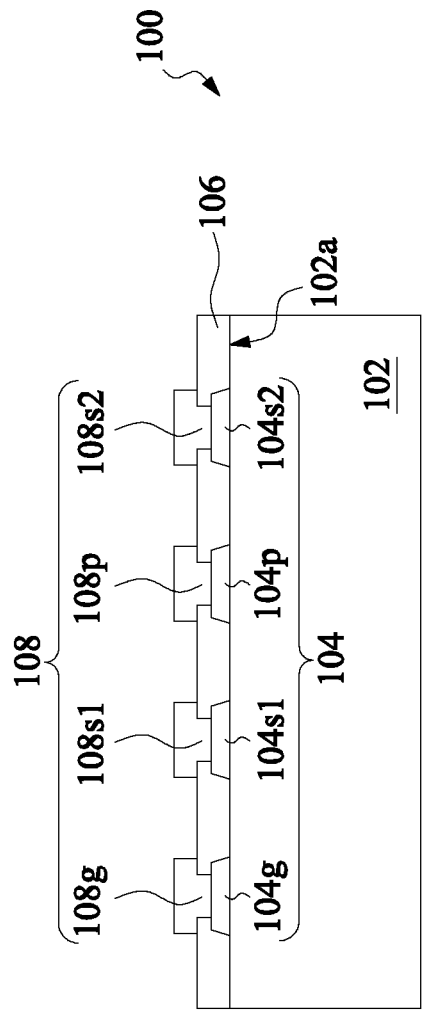

Referring to FIG. 5B, the conductive pillars 108 may be formed over the pins 104. The conductive pillars 108 may be formed by any suitable process, such as a deposition and etching, damascene or dual damascene, or the like with one or more of the above-mentioned conductive materials comprised in the conductive pillars 108. Although not illustrated in FIG. 5B, the ground bridging line 214 and the power bridging line 216 may also be formed at this step, e.g. on the surface of the passivation layer 106 facing away from the first die. The processes used for forming the ground bridging line 214 and the power bridging line 216 may be similar to the processes used for forming the conductive pillars 108. Furthermore, in an embodiment where the semiconductor device 100 includes the ground connector 308g and/or the power connector 308p, these features may also be formed at the step shown in FIG. 5B, e.g. on the surface of the passivation layer 106 facing away from the first die. The processes used for forming the ground connector 308g and/or the power connector 308p may be similar to the processes used for forming the conductive pillars 108.

Figure 5C:
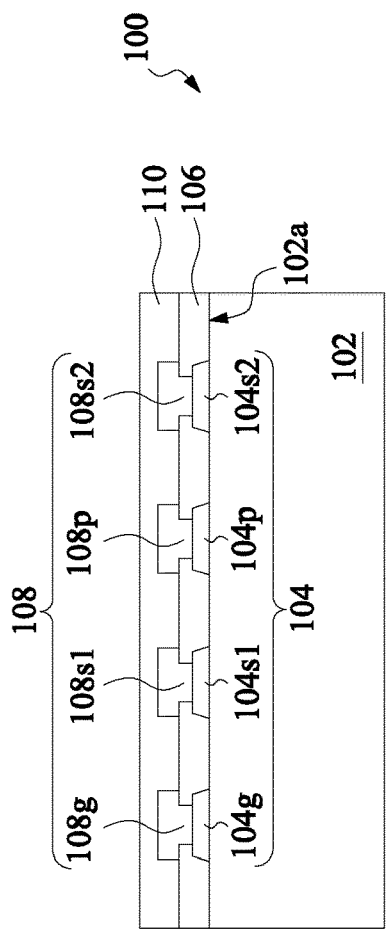

Referring to FIG. 5C, the polymer layer 110 may be formed over the conductive pillars 108, the passivation layer 106, the ground bridging line 214, and the power bridging line 216. Also, the polymer layer 110 covers the ground connector 308g and the power connector 308p, if these features are present. The process used for forming the polymer layer 110 may include CVD, PVD, ALD, combinations thereof, or the like. In the example of FIG. 5C, the polymer layer 110 surrounds the conductive pillars 108 on all surfaces of the conductive pillars 108.

Figure 5D:
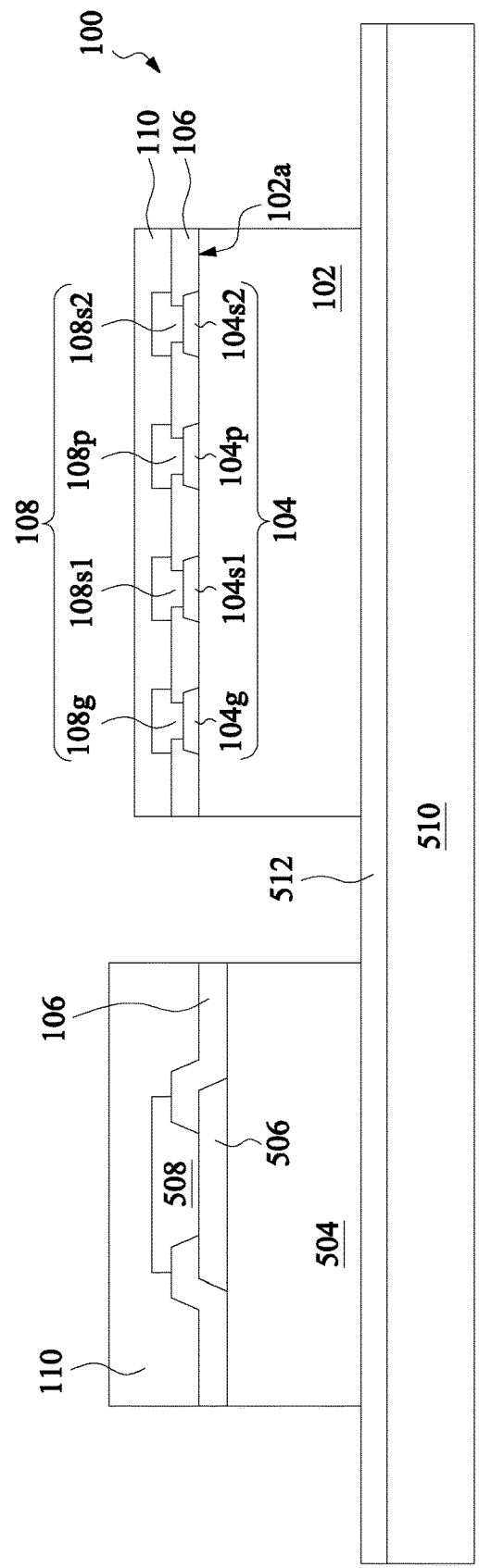

The above-mentioned steps may also be performed on a second die 504 (e.g. shown in FIG. 5D). The second die 504 may be a logic device, e.g. an APU, CPU, SOC, or the like, and may be included in a fan-out multi-die package together with the semiconductor device 100. Consequently, the second die 504 may be electrically connected to the first die 102 by the above-described signal traces 208.

Referring to FIG. 5D, the second die 504 may have a contact pad 506 and a bump 508 formed on or over the contact pad 506. The contact pad 506 and the bump 508 may be used for signal functions of the second die 504. In other words, the contact pad 506 may be a signal contact pad of the second die 504, while the bump 508 may be a signal conductive pillar of the second die 504. The peripheral portions of the contact pad 506 may be covered by the passivation layer 106. The polymer layer 110 may be disposed over the passivation layer 106 and may surround the bump 508 on all surfaces of the bump 508. The first die 102 and its overlying features as well as the second die 504 and its overlying features may be mounted on a carrier substrate 510, e.g. for subsequent processing. The carrier substrate 510 may be a glass carrier, a ceramic carrier, or the like. The first die 102 and the second die 504 may be attached to the carrier substrate 510 by an adhesive layer 512, which may comprise a dry attach film (DAF), a light-to-heat-conversion (LTHC) coating, combinations thereof, or the like.

Figure 5E:
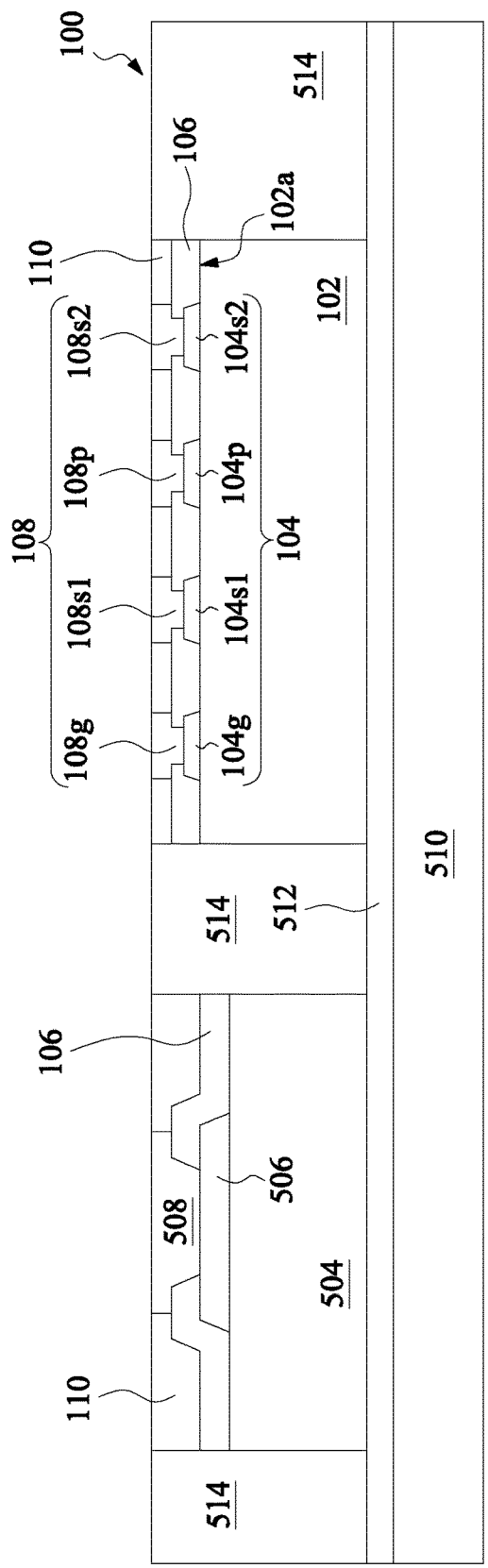

Referring to FIG. 5E, the first die 102 and the second die 504 are encapsulated in a molding compound 514 and a planarizing process (e.g. a grinding back process and/or a CMP process) may be performed so that the surfaces of the molding compound 514, the polymer layers 110, the bump 508, and the conductive pillars 108 are substantially co-planar.

Figure 5F:
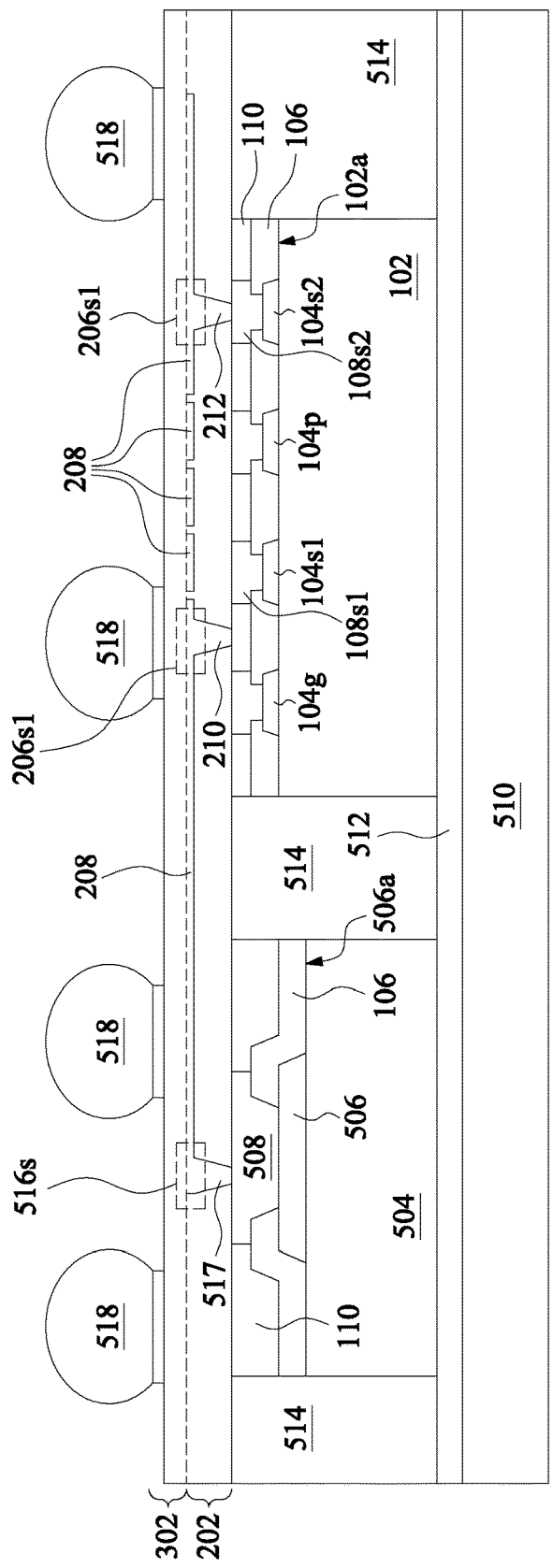

Referring to FIG. 5F, the first RDL 202 and the second RDL 302 comprising the signal traces 208, the ground traces, and the power traces may be formed over the molding compound 514 and the polymer layers 110 to allow for inter-die connections between the first die 102 and the second die 504. For example, the first insulating layer 204 of the first RDL 202 may be formed over the first side 102a of the first die 102 (e.g. memory device) and over a first side 504a of the second die 504 (e.g. logic device). The first insulating layer 204 may be formed by a chemical vapor deposition, a physical vapor deposition, an atomic layer deposition, or combinations thereof. In an embodiment where the first insulating layer 204 is substantially similar in composition to the polymer layer 110, the method for forming the polymer layer 110 may also be used to form the first insulating layer 204. Thereafter, openings may be formed in the first insulating layer 204 to expose the bump 508, the first signal conductive pillar 104s1, and the second signal conductive pillar 104s2. The openings may be formed by an etching process, a drilling process (e.g. laser drilling process), or combinations thereof. Following this, conductive material may be deposited or plated over a surface of the first insulating layer 104 facing away from the first die 102 and the second die 504. The conductive material (e.g. copper, tungsten, or the like) may also fill the openings formed in the first insulating layer 204. This may be followed by a patterning process (e.g. a masking and etching process) that is performed on the conductive material disposed over the surface of the first insulating layer 204 facing away from the first die 102 and the second die 504. This patterning process may yield the signal traces 208 shown in FIG. 5F as well as the first signal pads 206s1 and the second signal pads 206s2.

During the patterning of the conductive material, a logic signal pad 516s may also be formed on the first insulating layer 204 in addition to the signal traces 208, the first signal pads 206s1, and the second signal pads 206s2 (e.g. at the same interconnect level as the signal traces 208). The logic signal pad 516s may be coupled to the bump 508 by a fifth via 517 extending through the first insulating layer 204. As shown in FIG. 5F, the signal trace 208 may be coupled to the first signal pad 206s1 and the logic signal pad 516s, thereby electrically connecting the first die 102 and the second die 506 of the multi-die package to each other. External connectors 518 (e.g. solder balls, solder bumps, copper pillars, and the like) are also formed atop the first RDL 202 and the second RDL 302. As one skilled in the art will recognize, economies of scale can be obtained by forming multiple packaged devices on a single carrier wafer at a time. In such an embodiment, the processing step illustrated in FIG. 5F can be followed by the step of sawing or otherwise singulating the individual packages, proceeded by or followed by removal from the carrier substrate 510. This step is not show for the sake of brevity.

As discussed above, signal traces 208 can be routed— using the first RDL 202—in the space that would have otherwise been occupied by ground routing and/or power routing if the ground routing and/or power routing were formed on the same interconnect level as the signal traces 208. This allows for a greater number of signal traces 208 in the first RDL 202 and/or wider signal traces 208 and/or a larger spacing between immediately adjacent signal traces 208 in the first RDL 202, without having to decrease the width of the first signal pad 206s1 and/or the width of the second signal pad 206s2. For example, the signal traces 208 may be routed such that each signal trace 208 has a width of about 5 micrometers and is separated from an immediately adjacent signal trace 108 by about 5 micrometers. Having wider signal traces 208 and/or a larger spacing between immediately adjacent signal traces 208 may, in turn, improve performance of the multi-die package by lowering resistance and/or line capacitance.

According to various embodiments presented herein, a method includes forming a passivation layer over a front side of a die, where the die has a first plurality of signal pins and a plurality of power pins. A pillar layer is formed over the passivation layer. The pillar layer includes a conductive pillar aligned over and coupled to a respective one of each of the first plurality of signal pins and each of the plurality of power pins. A first insulating material layer is deposited over the pillar layer, the first insulating material layer having a signal opening formed over each conductive pillar of the plurality of signal pins. A signal pad is formed over each of the signal openings, where each signal pad is coupled to a respective one of the plurality of signal pins. A respective signal trace is coupled to each signal pad, wherein one or more signal traces overlaps at least one of the conductive pillars of the plurality of power pins.

According to various embodiments presented herein, a method includes forming a plurality of first conductive pillars and a plurality of second conductive pillars, where each of the first conductive pillars is respectively aligned to a pin in a first row of pins of a first die and where each of the second conductive pillars is respectively aligned to a pin in a second row of pins of the first die 102 A first insulating layer is formed on top surfaces of the plurality of first conductive pillars and on top surfaces of the plurality of second conductive pillars. A plurality of first pads are formed in a first row over the first insulating material in a first interconnect layer, where each of the plurality of first pads is aligned to and coupled to a respective underlying conductive pillar of the first plurality of conductive pillars. A plurality of first traces are formed over the first insulating material in the first interconnect layer, where each of the plurality of first traces are coupled to a respective first pad, and one or more of the plurality of first traces overlaps one or more conductive pillars of the plurality of second conductive pillars in plan view.

According to various embodiments presented herein, a method includes encapsulating a memory die and a logic die in a molding compound. A first insulating layer is deposited over the memory die, the logic die, and the molding compound. A first opening and a second opening are formed in the first insulating layer, the first opening exposing a signal conductive pillar of the memory die, the second opening exposing a signal conductive pillar of the logic die. The signal conductive pillars of the memory die and the logic die are electrically coupled by a signal trace disposed on the first insulating layer and overlapping a ground conductive pillar or a power conductive pillar of the memory die.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming a passivation layer over a front side of a die, the die having a first plurality of signal pins and a plurality of power pins;
   forming a pillar layer over the passivation layer, the pillar layer comprising a conductive pillar aligned over and coupled to a respective one of each of the first plurality of signal pins and each of the plurality of power pins;
   depositing a first insulating material layer over the pillar layer, the first insulating material layer having a signal opening formed over each conductive pillar of the first plurality of signal pins;
   forming a signal pad over each of the signal openings, each signal pad coupled to a respective one of the first plurality of signal pins; and
   forming a respective signal trace coupled to each signal pad, wherein one or more signal traces overlaps at least one of the conductive pillars of the plurality of power pins.

2. The method of claim 1, further comprising:
   depositing a second insulating material layer over the signal pads and signal traces.

3. The method of claim 1, further comprising:
   forming, in the pillar layer, a power bridging line coupling the conductive pillars of each of the plurality of power pins.

4. The method of claim 3, further comprising:
   forming a power connector over the passivation layer and adjacent to the plurality of power pins, wherein a bottom surface of the power connector is over a top surface of the passivation layer, and wherein the power connector is coupled to the power bridging line.

5. The method of claim 4, further comprising:
   depositing a second insulating material layer over the signal pads and signal traces;
   forming a first conductive via through the first insulating material layer and second insulating material layer, the first conductive via coupled to the power connector; and
   forming a power pad over the second insulating material layer coupled to the first conductive via.

6. The method of claim 1, wherein the die has a plurality of ground pins, and wherein the pillar layer further comprises a conductive pillar aligned over and coupled to a respective one of the plurality of ground pins;
   wherein the method further comprises:
   forming, in the pillar layer, a ground bridging line coupling the conductive pillars of each of the plurality of ground pins; and
   forming a ground connector over the passivation layer and adjacent to the plurality of ground pins, wherein a bottom surface of the ground connector is over a top surface of the passivation layer, and wherein the ground connector is coupled to the ground bridging line.

7. The method of claim 1, wherein the first plurality of signal pins are arranged by rows in top-down view, including a first signal row and a second signal row, wherein the plurality of power pins are arranged by rows in top-down view, wherein the plurality of power pins are interposed between the first signal row and the second signal row.

8. The method of claim 7, wherein the signal traces of the signal pads associated with the first signal row are routed between the first signal row and the second signal row.

9. The method of claim 1, further comprising:
   depositing a second insulating material layer over the signal pads and signal traces; and
   forming a power pad over the second insulating material layer, wherein the power pad is coupled to a supply power pin of the plurality of power pins, and wherein the supply power pin is not overlapped by a signal trace.

10. The method of claim 1, wherein one or more of the respective signal traces is coupled to a corresponding signal pin of a second die.

11. A method, comprising:
    forming a plurality of first conductive pillars and a plurality of second conductive pillars in a pillar level, wherein each of the first conductive pillars is respectively aligned to a pin in a first row of pins of a first die, and wherein each of the second conductive pillars is respectively aligned to a pin in a second row of pins of the first die;
    forming a first insulating layer on top surfaces of the plurality of first conductive pillars and on top surfaces of the plurality of second conductive pillars;
    forming a plurality of first pads in a first row over the first insulating layer in a first interconnect layer, each of the plurality of first pads being aligned to and coupled to a respective underlying conductive pillar of the first plurality of conductive pillars; and
    forming a plurality of first traces over the first insulating layer in the first interconnect layer, each of the plurality of first traces coupled to a respective first pad, one or more of the plurality of first traces overlapping one or more conductive pillars of the plurality of second conductive pillars in plan view.

12. The method of claim 11, wherein the pins in the first row of pins correspond to signal pins of the first die, and the pins in the second row of pins correspond to power pins or ground pins of the first die.

13. The method of claim 11, wherein the first die comprises a wide input-output (I/O) memory device.

14. The method of claim 11, further comprising:
coupling the plurality of second conductive pillars together by a bridging line physically coupled to sidewalls of the second conductive pillars together, wherein the bridging line is embedded in the first insulating layer, and wherein one or more of the plurality of first traces overlap the bridging line in plan view.

15. The method claim 11, further comprising:
coupling a distal end of the plurality of first traces to a corresponding pad of a second die.

16. The method claim 11, wherein the first conductive pillars and the second conductive pillars are separated by a distance in a range from about 10 micrometers to about 60 micrometers.

17. A method comprising:
encapsulating a memory die and a logic die in a molding compound;
depositing a first insulating layer over the memory die, the logic die, and the molding compound;
forming a first opening and a second opening in the first insulating layer, the first opening exposing a signal conductive pillar of the memory die, the second opening exposing a signal conductive pillar of the logic die; and
electrically coupling the signal conductive pillars of the memory die and the logic die by a signal trace, wherein the signal trace is disposed on the first insulating layer and overlaps a ground conductive pillar or a power conductive pillar of the memory die, in a plan view.

18. The method of claim 17, wherein the electrically coupling the signal conductive pillars of the memory die and the logic die comprises:
depositing a conductive material over a surface of the first insulating layer facing away from the memory die and the logic die, the conductive material filling the first opening and the second opening; and
patterning the conductive material on the surface of the first insulating layer to form the signal trace.

19. The method of claim 17, wherein the depositing the first insulating layer comprises a chemical vapor deposition, a physical vapor deposition, an atomic layer deposition, or combinations thereof.

20. The method of claim 17, wherein the forming the first opening and the second opening in the first insulating layer comprises an etching process, a drilling process, or combinations thereof.

* * * * *

UNITED STATES PATENT AND TRADEMARK OFFICE
CERTIFICATE OF CORRECTION

PATENT NO. : 9,984,969 B2  
APPLICATION NO. : 15/601734  
DATED : May 29, 2018  
INVENTOR(S) : Chen-Hua Yu Page 1 of 1

It is certified that error appears in the above-identified patent and that said Letters Patent is hereby corrected as shown below:

On the Title Page

Item (54) and in the Specification, Column 1, Line 3, delete "MANUFACURE" and insert --MANUFACTURE--.

Signed and Sealed this
Seventh Day of August, 2018

Andrei Iancu
*Director of the United States Patent and Trademark Office*